(12) United States Patent
Mawatari

(10) Patent No.: US 7,986,561 B2
(45) Date of Patent: Jul. 26, 2011

(54) SEMICONDUCTOR MEMORY DEVICE

(75) Inventor: Hiroshi Mawatari, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 214 days.

(21) Appl. No.: 12/388,873

(22) Filed: Feb. 19, 2009

(65) Prior Publication Data
US 2009/0219762 A1 Sep. 3, 2009

(30) Foreign Application Priority Data
Mar. 3, 2008 (JP) .................. 2008-051663

(51) Int. Cl.
*G11C 11/34* (2006.01)
*G11C 16/06* (2006.01)
(52) U.S. Cl. .................. 365/185.23; 365/185.18
(58) Field of Classification Search ............ 365/185.23, 365/185.25, 185.18
See application file for complete search history.

(56) References Cited

U.S. PATENT DOCUMENTS

| 7,002,846 | B2 | 2/2006 | Okimoto et al. | |
| 7,292,477 | B2 | 11/2007 | Honda | |
| 7,518,921 | B2 * | 4/2009 | Maejima et al. | 365/185.17 |
| 2005/0024944 | A1 | 2/2005 | Tanaka | |
| 2006/0120158 | A1 | 6/2006 | Tanaka | |
| 2007/0147122 | A1 * | 6/2007 | Arai et al. | 365/185.18 |
| 2008/0068893 | A1 | 3/2008 | Tanaka | |
| 2009/0273976 | A1 * | 11/2009 | Maejima et al. | 365/185.05 |

FOREIGN PATENT DOCUMENTS

| JP | 11-110977 A | 4/1999 |
| JP | 2005-122772 A | 5/2005 |
| JP | 2005-122841 A | 5/2005 |
| JP | 2005-174414 A | 6/2005 |
| JP | 2006-294142 A | 10/2006 |

* cited by examiner

*Primary Examiner* — Anh Phung
(74) *Attorney, Agent, or Firm* — Arent Fox LLP

(57) ABSTRACT

A semiconductor memory device comprises memory cells which includes a selection transistor and a memory transistor; selection gate lines coupled to a gate of the selection transistor; control gate lines coupled to the control gate of the memory transistor; source lines coupled to a source of the memory transistor; bit lines coupled to the selection transistor; a selection gate line driver circuit; a control gate line driver circuit; and a source line driver circuit, wherein the selection gate line driver circuit comprises a first transistor including a first gate insulation film and drives the selection gate line with a first driving voltage, and the control gate line driver circuit and the source line driver circuit comprise a second transistor including second gate insulation films and drive the control gate line and the source line with a boost voltage higher than the first driving voltage.

11 Claims, 10 Drawing Sheets

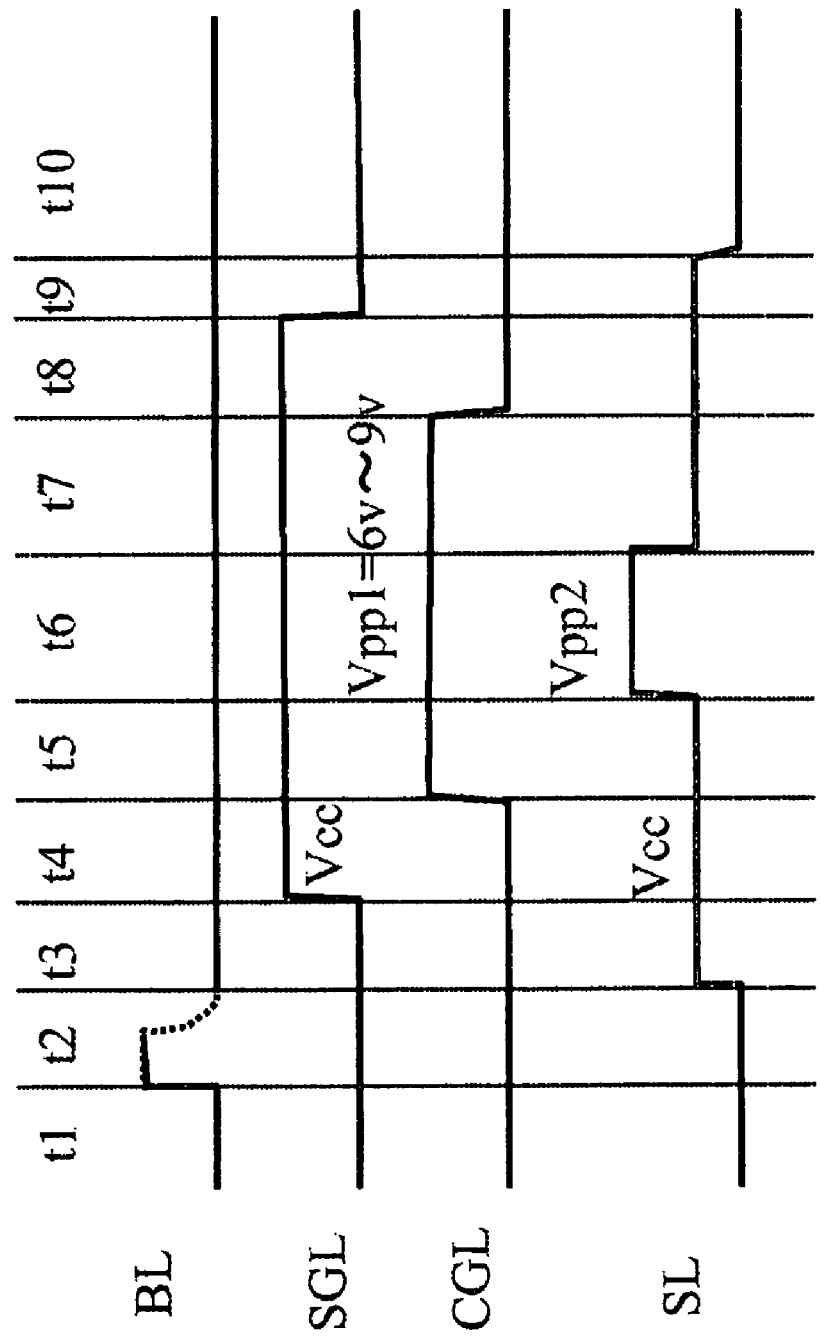

SEMICONDUCTOR MEMORY DEVICE

CROSS-REFERENCE TO RELATED APPLICATIONS

This application claims the benefit of priority from Japanese Patent Application No. 2008-51663 filed on Mar. 3, 2008, the entire contents of which are incorporated herein by reference.

BACKGROUND OF THE INVENTION

1. Field of the Invention

This application relates to a non-volatile semiconductor memory device.

2. Description of Related Art

A flash memory, which is a non-volatile semiconductor memory device, stores electric charges in floating gates thereof. A cell transistor, provided at a position where a bit line and a word line of the flash memory intersect with each other, includes a floating gate. The bit line is coupled to a drain of the cell transistor, the word line is coupled to a control gate of the cell transistor, and a source line is coupled to a source of the cell transistor. The flash memory has a state where electrons (negative charges) are not being injected in the floating gate (data 1: erased state) and a state where electrons are being injected therein (data 0: programmed state).

Techniques related thereto are discussed in Japanese Laid-open Patent Publication No. H11-110977, Japanese Laid-open Patent Publication No. 2005-122841, Japanese Laid-open Patent Publication No. 2005-174414, Japanese Laid-open Patent Publication No. 2006-294142 or the like.

SUMMARY

According to aspects of an embodiment, a non-volatile semiconductor memory device is provided. The semiconductor memory device comprises: a plurality of memory cells which includes a selection transistor and a memory transistor having a control gate which is coupled to the selection transistor; a plurality of selection gate lines coupled to a gate of the selection transistor; a plurality of control gate lines coupled to the control gate of the memory transistor; a plurality of source lines coupled to a source of the memory transistor; a plurality of bit lines that intersects the selection gate line and is coupled to the selection transistor; a selection gate line driver circuit that drives the plurality of selection gate lines; a control gate line driver circuit that drives the plurality of control gate lines; and a source line driver circuit that drives the plurality of source lines, wherein the selection gate line driver circuit comprises a first transistor including a first gate insulation film and drives the selection gate line with a first driving voltage, and the control gate line driver circuit and the source line driver circuit comprise a second transistor including second gate insulation films and respectively drives the control gate line and the source line with a boost voltage higher than the first driving voltage.

Additional advantages and novel features in accordance with aspects of the invention will be set forth in part in the description that follows, and in part will become more apparent to those skilled in the art upon examination of the following or upon learning by practice of the invention.

BRIEF DESCRIPTION OF THE DRAWINGS

FIG. 6 illustrates a programming sequence.

DESCRIPTION OF PREFERRED EMBODIMENTS

Figure 1:
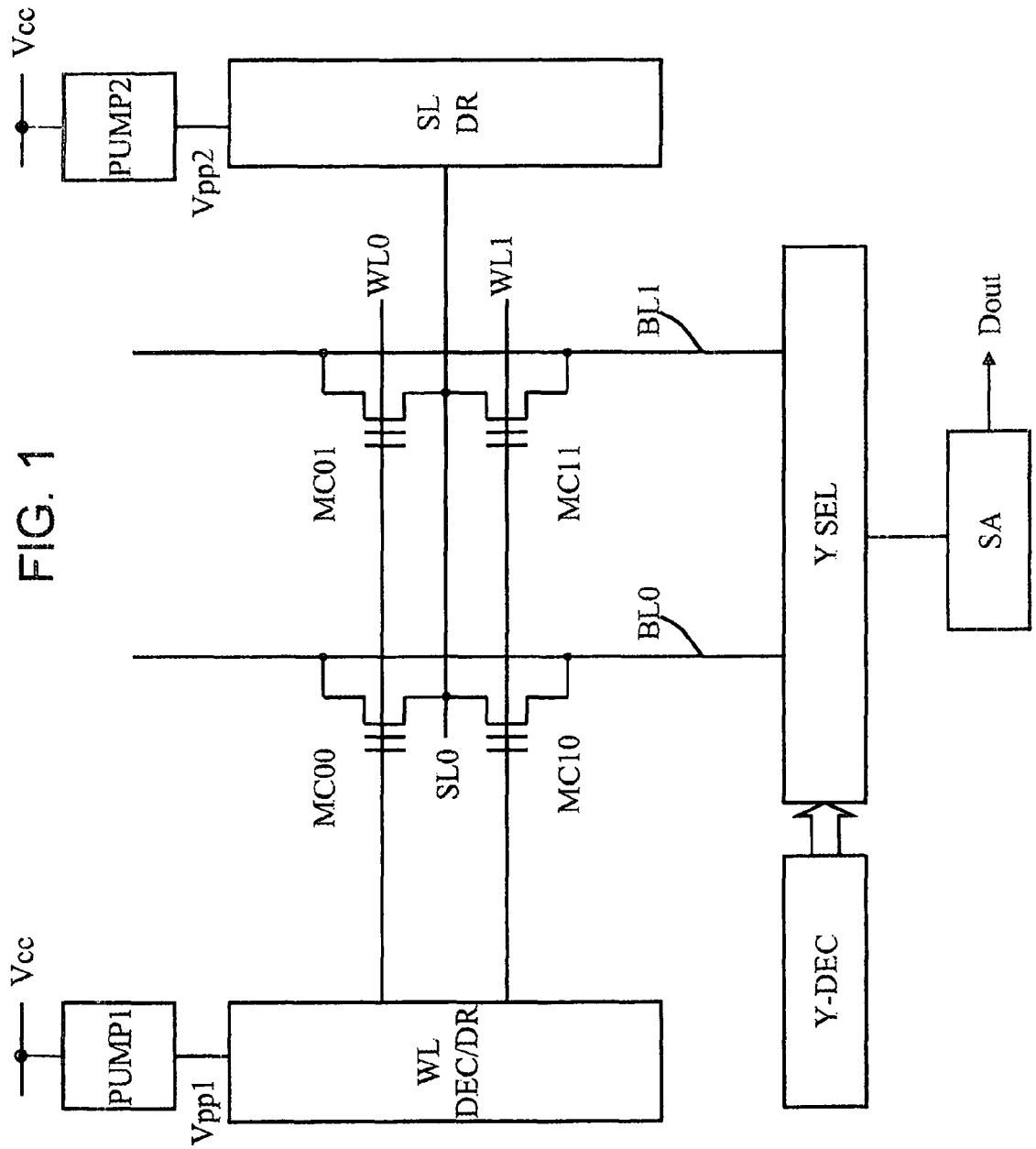
FIG. 1 illustrates an exemplary non-volatile semiconductor memory device.

After all of the cell transistors have been brought into an erased state, programming is performed on cell transistors. A high voltage pulse (for example, 10 Volts) is applied to a control gate of the cell transistor, which is to be programmed. A high voltage pulse (for example, 5 Volts) is applied to a drain of the cell transistor, which is to be programmed. A low voltage pulse (for example, 0 Volts) is applied to a source of the cell transistor, which is to be programmed Hot electrons, which are generated between the drain and the source, are injected in a floating gate. During a program-verify process, a program-verify voltage is applied to the control gate, to confirm that the cell transistor is placed in an OFF state. Program pulses are repeatedly applied until it is confirmed that the cell transistor is placed in the OFF state during the program-verify process.

During a read operation, a read reference voltage is applied to a control gate of a selected cell transistor. Whether the cell transistor becomes conductive (Data 1 where electrons are not injected) or the cell transistor is placed in a non-conductive state (Data 0 where electrons are injected) is detected based upon a potential of a bit line.

After all of the cell transistors have been brought into a programmed state, an erase operation is performed. During the erase operation, the drain and the source of the cell transistor are brought into a floating state. A negative voltage pulse is applied to the control gate, and a high positive voltage pulse is applied to a substrate. Owing to Fowler-Nordheim (F-N) tunnel phenomenon, electrons in the floating gate are extracted on a substrate side. An erasing pulse is applied to all of the cell transistors within a block. An erase-verify voltage is applied to the control gate of each of the cell transistors during an erase-verify process, to confirm that the cell transistors are placed in an ON state. The erasing pulse is repeatedly applied until all of the cell transistors pass an erase-verify operation.

During the erase operation, the erasing pulse is repeatedly applied to all of the cell transistors in the block, and it is confirmed that a threshold voltage of the cell transistors has dropped up to an erase-verify level. The erasing pulse is repeatedly applied concurrently until all of the cell transistors pass the erase-verify operation. Due to a fluctuation in cell transistor characteristics in the block, electrons are extracted from the floating gates of some of the cell transistors, and positive charges are injected therein. Consequently, these cell transistors are brought into a negative threshold voltage state (over-erased state) The over-erased state causes a drain current, as a leakage current, to be generated in the cell transistors that are not selected during the read operation. This makes it difficult to detect an ON state or an OFF state of the selected cell transistors based upon a bit line potential.

During a programming operation, it is preferable that a control gate coupled to a word line of the cell transistor and a drain coupled to a bit line of the cell transistor be driven with a high voltage. For this reason, it is preferable that a word line drive circuit and a bit line selection circuit include a high voltage-resistant transistor having a thick gate oxidation film and a large gate width.

A threshold voltage of the high voltage-resistant transistor is high, and a low voltage power supply is not preferable to drive the high voltage-resistant transistor.

FIG. 1 illustrates an exemplary non-volatile semiconductor memory device. The semiconductor memory device includes a plurality of word lines WL0 and WL1, a plurality of bit lines BL0 and BL1 that intersect the word lines WL0 and WL1, cell transistors MC00 to MC11 each provided at a position where each of the word lines WL0 and WL1 and each of the bit lines BL0 and BL1 intersect. With regard to the cell transistor MC00, a control gate is coupled to the word line WL0, a drain is coupled to the bit line BL0, and a source is coupled to a source line SL0. The other cell transistors are coupled in the same manner. The bit lines BL0 and BL1 are coupled, via a column selection circuit Y-SEL, to a sense amplifier SA. The column-selection circuit Y-SEL causes a corresponding column selection switch to become conductive based upon a column selection signal (not shown) selected by a column decoder Y-DEC and couples the selected bit line to the sense amplifier SA. The sense amplifier SA outputs a data Dout. A word line decoder-drive circuit WLDEC/DR selects one of the word lines WL0 and WL1 and drives the selected word line with a predetermined boost voltage Vpp1. A source line driver circuit SLDR drives the source line SL0 with a predetermined boost voltage Vpp2. A voltage boosting circuit PUMP1 and a voltage boosting circuit PUMP2 boost a power supply voltage Vcc and generate a first boost voltage Vpp1 and a second boost voltage Vpp2.

Figure 2:
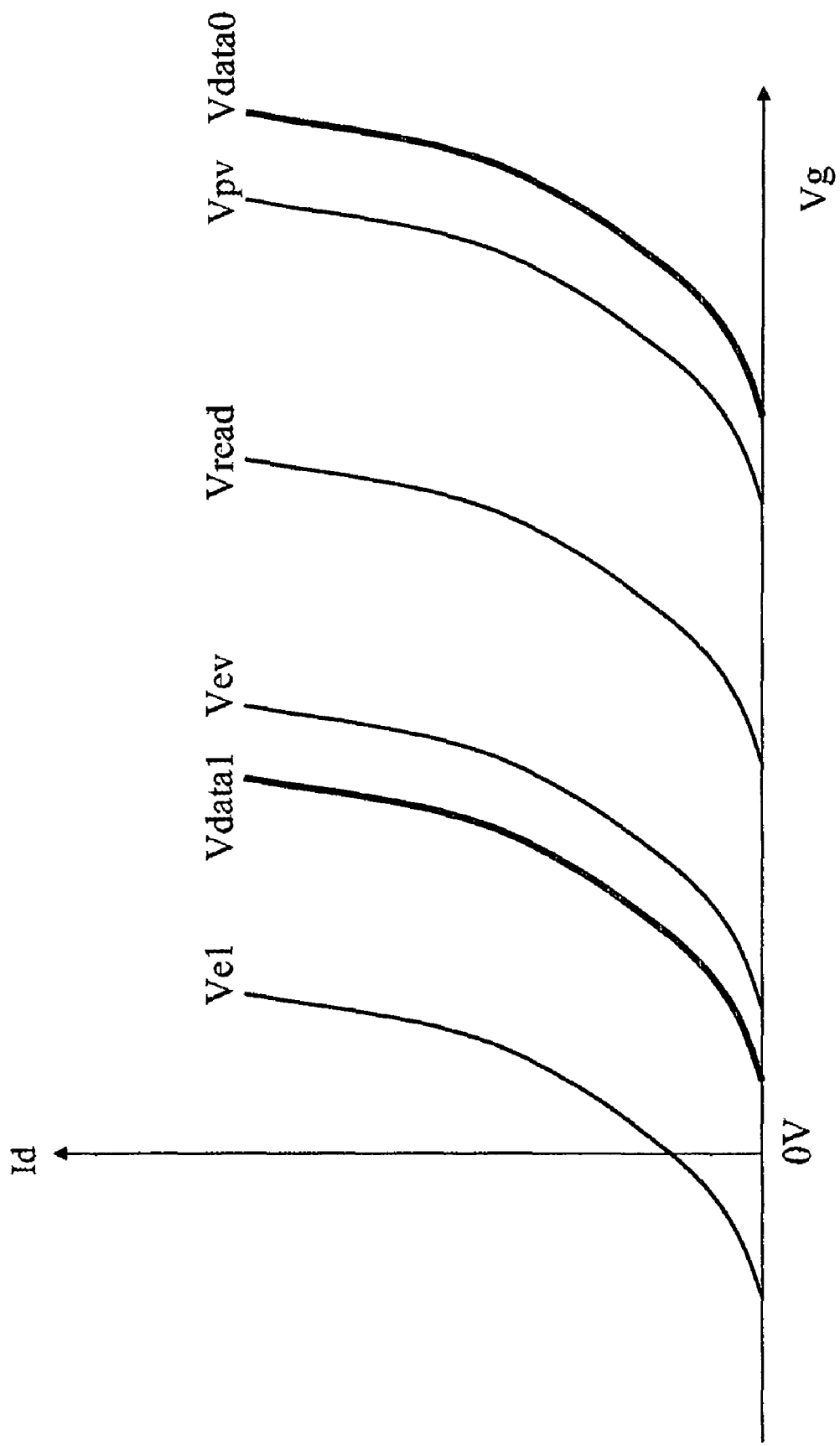
FIG. 2 illustrates Vg-Id characteristics of a cell transistor.

FIG. 2 illustrates Vg-Id characteristics of the cell transistor. With regard to the semiconductor memory device, an erased state where electrons (negative charges) are not being injected in the floating gate corresponds to the data 1, and the threshold voltage of the cell transistor is low. The programmed state where electrons are being injected in the floating gate corresponds to the data 0, and the threshold voltage of the cell transistor is high. The cell transistor placed in the erased state corresponds to a characteristic Vdata 1. When a gate voltage Vg between the characteristic Vdata 0 and the characteristic Vdata 1 is applied to the word lines WL during the read operation, the cell transistor becomes conductive or non-conductive in response to memory data. The cell transistor placed in the programmed state corresponding to a characteristic Vdata 0. The bit line potential differs depending on whether a cell current exists or not. The sense amplifier SA outputs the data Dout based upon the bit line potential.

After all of the cell transistors have been brought into the erased state, the programming operation is performed. During the programming operation, a control gate of the selected cell transistor may be driven, for example, to 10 Volts via the word line. A drain of the selected cell transistor is driven to 5 Volts via the bit line. A source of the selected cell transistor is driven to 0 Volts via the source line. Hot electrons are generated between the drain and the source of the cell transistor, and electrons are injected in the control gate. The cell transistor exceeds a program-verify level Vpv to go to the characteristic Vdata 0 in the programmed state. With regard to a program-verify operation, for example, approximately 5.5 Volts may be applied to the control gate, and it is confirmed whether or not the cell transistor becomes non-conductive.

After all of the cell transistors have been brought into the programmed state, the erase operation is performed. During the erase operation, the sources and the drains of all cell transistors in the block are brought into the floating state. The control gate may be driven with, for example, −9 Volts via the word line, and the substrate may be driven with, for example, +9 Volts, so that electrons (negative charges), placed in the gate with the floating state, are extracted. Owing to this, the cell transistor exceeds an erase-verify level Vev to go to the characteristic Vdata 1 in the erased state. With regard to the erase-verify operation, a voltage of, for example, 2 Volts to 3 Volts may be applied to the control gate, and it is confirmed whether or not the cell transistor becomes conductive.

Since an erase voltage is concurrently applied to the cell transistors in the block during the erase operation, it may occur that some of the cell transistors are brought into the over-erased state Ve1. A leakage current occurs in the cell transistor placed in the over-erased state Ve1 even if the word line is placed in a non-selection state (ground potential) during the read operation. The leakage current affects a potential of the bit line. The read operation, in which it is detected whether a current of the selected cell transistor exists or not by means of the bit line potential, is affected by the leakage current.

A word line decoder-drive circuit WLDEC/DR, for example, selects the pair of word lines WL0 and WL1 and drives the selected word lines WL0 and WL1 with the predetermined boost voltage Vpp1. The source line driver circuit SLDR drives the source line SL0 with the predetermined boost voltage Vpp2. These circuits include high voltage-resistant transistors. Since a threshold voltage of the high voltage-resistant transistor is higher than that of a micro-fabrication transistor, the high voltage-resistant transistor driven with the power supply voltage Vcc (for example, approximately 2 Volts) does not generate a sufficient ON current, and thus an operation of the high voltage-resistant transistor becomes slower. When the high voltage-resistant transistor is driven with the boost voltages generated by the voltage boosting circuits PUMP1 and PUMP2, the ON current becomes great enough, whereas an access speed decreases due to a boosting operation.

Figure 3:
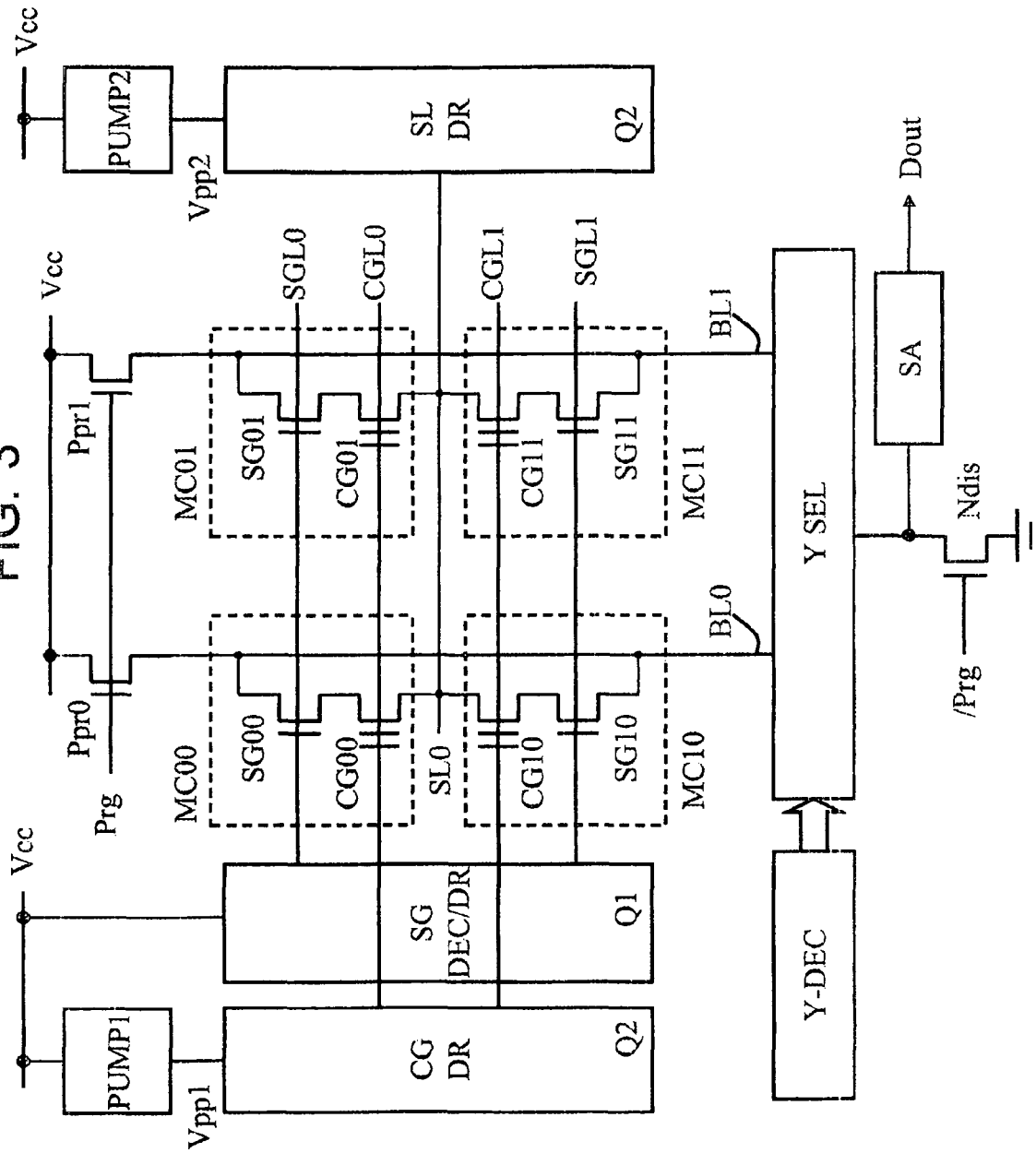
FIG. 3 illustrates an embodiment.

FIG. 3 illustrates an embodiment. Memory cells MC00 to MC11 are arranged in two rows and two columns. Each of memory cells MC, MC00 through MC11, includes one of selection transistors SG00 through SG11 and one of memory transistors CG00 through CG11. Each selection transistor and each memory transistor are coupled in series. For example, the selection transistor SG00 of the memory cell MC00 may be a typical N-channel MOS transistor, which does not include a floating gate. A gate of the N-channel MOS transistor is coupled to a selection gate line SGL0, and a drain of the N-channel MOS transistor is coupled to a bit line BL0. A memory transistor CG00 of the memory cell CG00 is an N-channel MOS transistor, which includes a floating gate. A control gate of the N-channel MOS transistor is coupled to a control gate line CGL0, and a source of the N-channel MOS transistor is coupled to a source line SL0. A structure of the memory transistor CG00 may be similar to or the same as a structure of a cell transistor of a typical non-volatile semiconductor memory device. A data storing method of the memory transistor CG00 may be similar to or the same as a data storing method as shown in FIG. 2.

The selection gate line SGL0 and a selection gate line SGL1 are provided extending in rows. The selection gate lines SGL0 and SGL1 are selected and driven by a selection gate line decoder-driver SGDEC/DR. The control gate line CGL0 and a control gate line CGL1, and the source line SL0 are also provided extending in rows. However, since selection based upon an address is not performed on the control gate line CGL0, the control gate line CGL1, and the source line SL0, they may also be provided extending in columns. A control gate line driver CGDR and a source line driver SLDR drive the control gate line CGL0, the control gate CGL1, and the source line SL0 with predetermined boost voltages Vpp1 and Vpp2, respectively. Voltage boosting circuits PUMP1 and PUMP2 are provided.

The bit line BL0 and a bit line BL1 are provided extending in columns and intersect the selection gate lines SGL0 and SGL1. The bit lines BL0 and BL1 are coupled to a power supply voltage Vcc via pre-charge transistors Ppr0 and Ppr1 each including a P-channel MOS transistor. A column selection circuit Y-SEL selects one of bit lines BL0 and BL1 in response to a selection signal from a column decoder Y-DEC and couples the selected bit line BL to a sense amplifier SA. A discharge transistor Ndis including an N-channel MOS transistor is coupled to the selected bit line BL.

The memory cell MC is selected in the following manner. The selection gate line decoder-driver circuit SGDEC/DC selects one of the selection gate lines SGL0 and SGL1 based upon an address and drives the selected selection gate line SGL with the power supply voltage Vcc. The column selection circuit Y-SEL selects one of the bit lines BL0 and BL1 and couples the selected bit line BL to the sense amplifier SA or the discharge transistor Ndis. In response to one of the selection gate lines SGL0 and SGL1 being driven with the power supply voltage Vcc, the selection transistors SG00 to SG11, arranged in rows, become conductive, and the memory transistors CG00 to CG11 are coupled to the bit lines. In response to one of the bit lines BL0 and BL1 being selected, one memory cell MC is selected.

In the embodiment, the selection gate lines SGL0 and SGL1 are selected based upon the address and driven with the power supply voltage Vcc. The selection gate line decoder-driver circuit SGDEC/DR includes a micro-fabrication transistor Q1. For example, the selection gate line decoder-driver circuit SGDEC/DR may include a CMOS circuit having a micro-fabrication transistor. The control gate lines CGL0 and CGL1 are driven with a high programming voltage Vpp1 during the programming operation. The source line SL0 is also driven with a high voltage Vpp2 during the programming operation. For this reason, the control gate line driver circuit CGDR and the source line driver circuit SLDR include high voltage-resistant transistors Q2. For example, the control gate line driver circuit CGDR and the source line driver circuit SLDR may include CMOS circuits having high voltage-resistant transistors.

The selection gate line decoder-driver circuit SGDEC/DR including the micro-fabrication transistor Q1 selects the selection gate line SGL based upon the address and drives the selected selection gate line SGL with the power supply voltage Vcc. Thus the selection gate line decoder-driver circuit SGDEC/DR is capable of operating at a high speed. Since a driving operation at a high voltage is preferable for the control gate line driver circuit CGDR and the source line driver circuit SLDR, the control gate line driver circuit CGDR and the source line driver circuit SLDR each include the high voltage-resistant transistor Q2. However, since selection of the control gate line or the source line based upon the address is unnecessary for the control gate line driver circuit CGDR and the source line driver circuit SLDR, a high-speed operation is also unnecessary.

Figure 4:
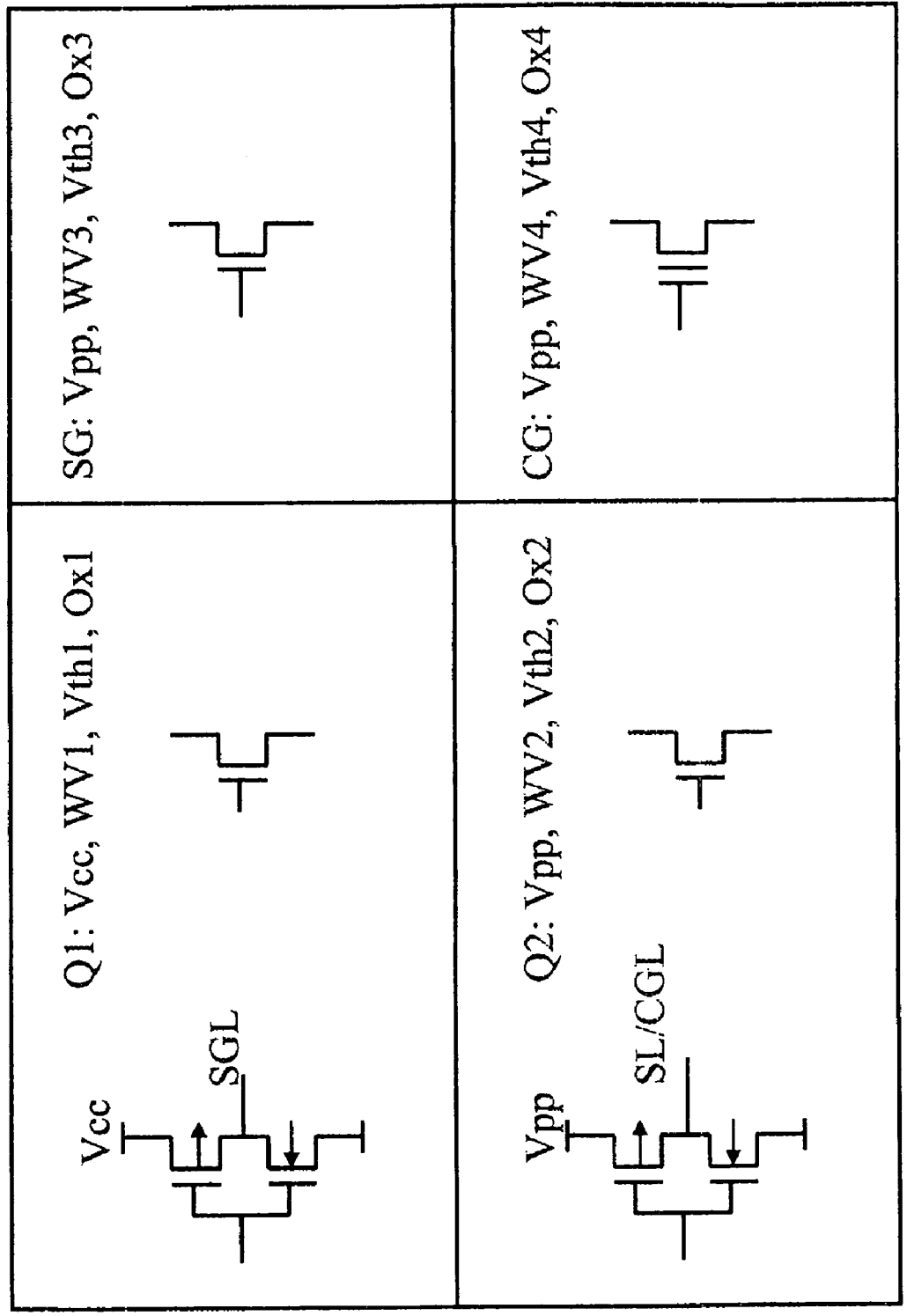
FIG. 4 illustrates types of transistors.

FIG. 4 illustrates types of transistors. The micro-fabrication transistor Q1 includes an N-channel MOS transistor or a P-channel MOS transistor, each driven with a power supply voltage Vcc of approximately 2 Volts or preferably 1.8 Volts Since a gate oxidation film Ox1 of the micro-fabrication transistor Q1 is thin, a threshold voltage Vth1 thereof is low, such as, approximately 0.2 Volts, and a withstand voltage WV1 is also low. The selection gate line decoder/driver SGDEC/DR, having the micro-fabrication transistor Q1, may include, for example, a CMOS inverter, including a P channel micro-fabrication transistor Q1 and an N-channel micro-fabrication transistor Q1, at a last stage thereof. The power supply voltage Vcc is applied to a source of the P channel micro-fabrication transistor, and the power supply voltage Vcc and a GND are applied to a gate of the CMOS inverter.

The high voltage-resistant transistor Q2 includes an N-channel MOS transistor or a P-channel MOS transistor and is driven with the boost voltage Vpp of 5 Volts to 10 Volts or with the power supply voltage Vcc. Since a gate oxidation film Ox2 of the high voltage-resistant transistor Q2 is thicker than the gate oxidation film Ox1, a threshold voltage Vth2 thereof is approximately 0.8V, that is, higher than the threshold voltage Vth1, and a withstand voltage WV2 is higher than the withstand voltage WV1. The control gate line driver CGLDR and the source line driver SLDR, each having the high voltage-resistant transistor Q2, each include a CMOS inverter having a P-channel micro-fabrication transistor Q2 and an N-channel micro-fabrication transistor Q2, at a last stage thereof. The boost voltage Vpp is applied to a source of the P-channel micro-fabrication transistor.

The memory transistor CG includes an N-channel MOS transistor having a floating gate. The boost voltages Vpp1 and Vpp2 may be applied thereto during the programming operation, a read operation or the like. For this reason, a oxidation film Ox4 including a tunnel oxidation film and an oxidation film between the floating gate and the control gate are thicker than the oxidation films of the micro-fabrication transistor Q1 and the high voltage-resistant transistor Q2, and a withstand voltage WV4 and a threshold voltage Vth4 are higher than the withstand voltages and the threshold voltages of the micro-fabrication transistor Q1 and the high voltage-resistant transistor Q2.

The selection gate transistor SG short-circuits a floating gate and a control gate of the memory transistor CG. The boost voltage Vpp may be applied thereto during the programming operation or the like. For this reason, a tunnel oxidation film Ox3 is thicker than the oxidation films of the micro-fabrication transistor Q1 and the high voltage-resistant transistor Q2. On the other hand, the thickness of the tunnel oxidation film Ox3 is equal to or thinner than the thickness of the oxidation film Ox4 of the memory transistor CG. If the thickness of the tunnel oxidation film Ox3 is thinner than the thickness of the oxidation film Ox4, the withstand voltage WV3 and the threshold voltage Vth3 become higher than the withstand voltages and the threshold voltages of the micro-fabrication transistor Q1 and the high voltage-resistant transistor Q2. On the other hand, the withstand voltage WV3 and the threshold voltage Vth3 are lower than those of the memory transistor CG.

Figure 5A:
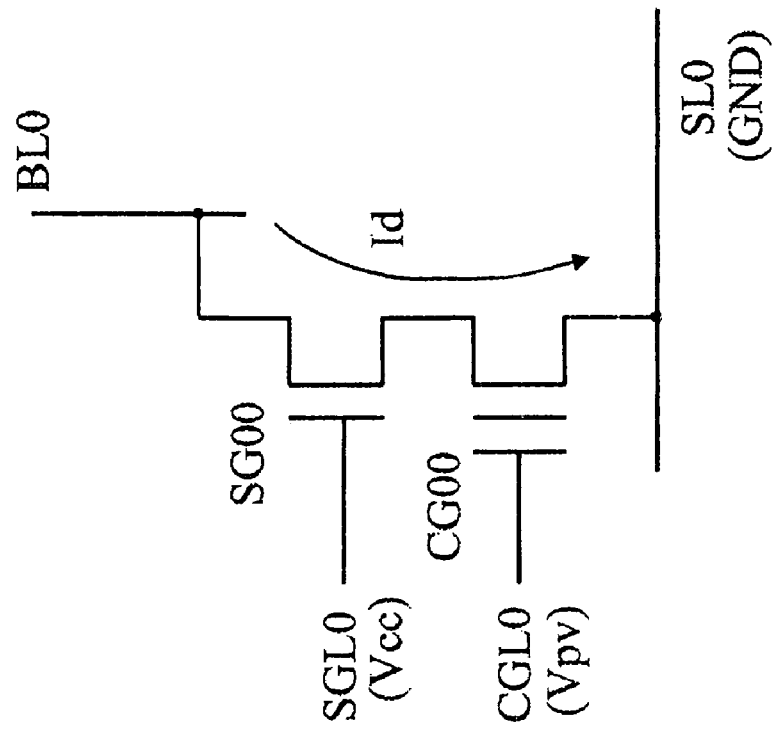
FIG. 5 illustrates programming operations.
Figure 5B:
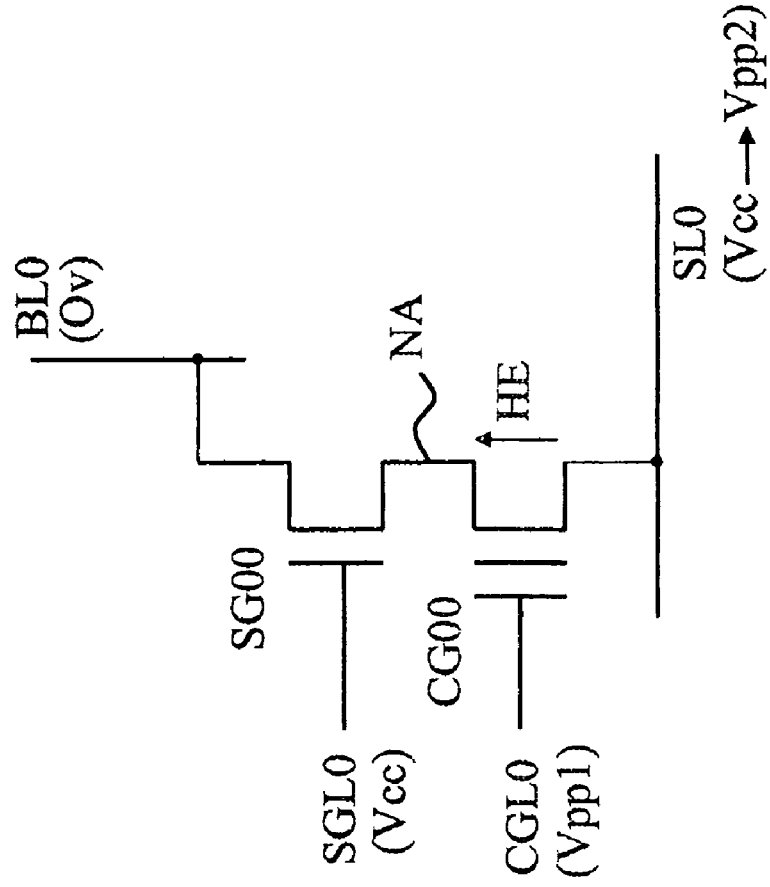
Figure 7:
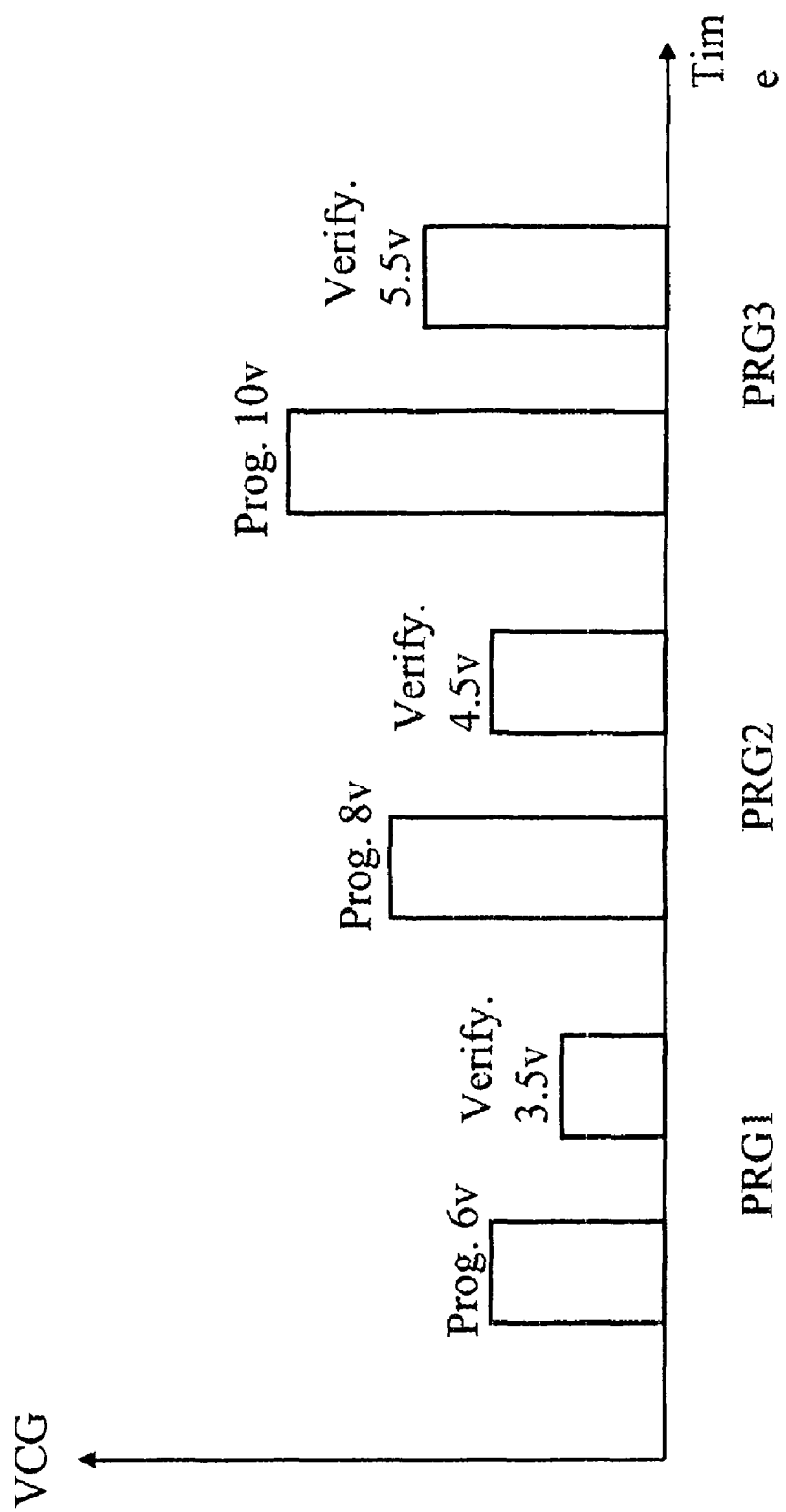
FIG. 7 illustrates a programming sequence.
Figure 8:
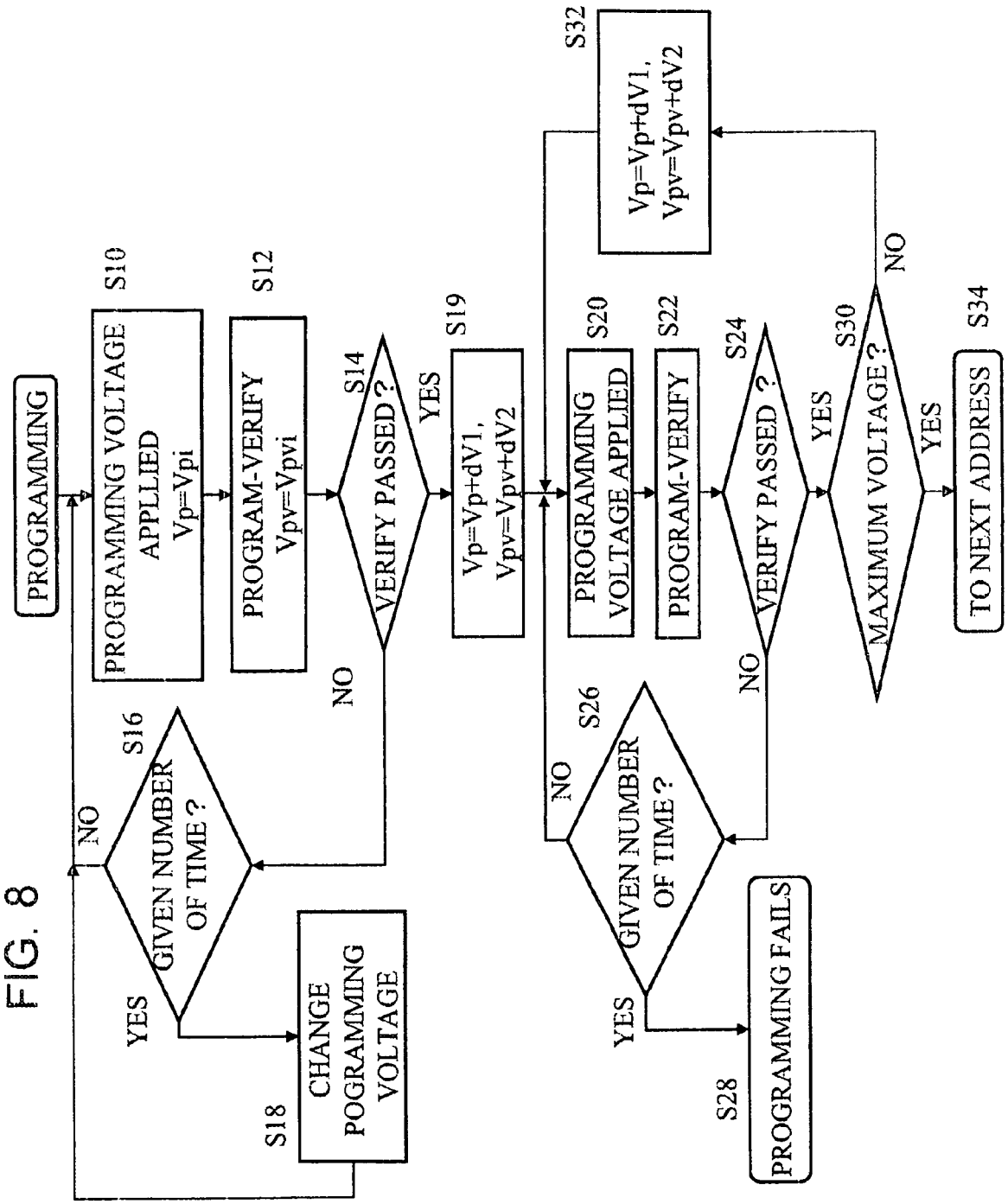
FIG. 8 illustrates a flowchart of the programming operation.

FIGS. 5A and 5B illustrate programming operations. FIGS. 6 and 7 illustrate a programming sequence. FIG. 8 illustrates a flowchart of the programming operation. After the memory transistors CG00 to CG11 in all of the memory cells MC00 to MC11 are brought into the erased state, the programming operation starts with selecting a memory cell.

All of the bit lines BL0 and BL1 are pre-charged to the power supply voltage Vcc by the pre-charge transistors Ppr0 and Ppr2 during a time t1. The selected bit line BL0 is coupled to the discharge transistor Ndis by the column selection circuit Y-SEL and discharged to a ground potential. During a time t3, the source line driving circuit SLDR drives all of the source lines SL to the power supply voltage Vcc. During a time t4, the selection gate line decoder-driver circuit SGDEC/

DR drives the selection gate line SG0, which was selected based upon the address, to the power supply voltage Vcc.

During a time t5, the control gate line drive circuit CGDR drives all of the control gate lines CG0 and CG1 to the programming voltage Vpp1. It is desirable that the programming voltage Vpp1 be applied by sequentially boosting the programming voltage Vpp1 from a lower voltage to a higher voltage. During a time t6, the source line drive circuit SLDR drives all of the source lines SL from the power supply voltage Vcc to a boost voltage Vpp2 of approximately 5.5 Volts.

FIG. 5A illustrates a voltage applied during the time t5 and the time t6 of the programming operation. Since the selection gate line SGL0 of the selected memory cell MC00 is brought into the power supply voltage Vcc and the bit line BL0 of the selected memory cell MC00 is brought into the ground potential, the selection transistor SG00 of the selected memory cell MC00 becomes conductive. Since the selection gate SGL of a memory cell, which is not selected, is brought into the ground potential or the bit line BL of the memory cell, which is not selected, is brought into the pre-charged level Vcc, the selection transistor SG of the memory cell, which is not selected, does not become conductive. During the time t6, the boosted programming voltage Vpp1 is applied to a control gate of the memory transistor CG00 and the boost voltage Vpp2 is applied to the source line SL0, respectively. For this reason, a current flows toward a node NA from a source coupled to the source line SL0, so that hot electrons HE are generated. The hot electrons HE are injected in the control gate of the memory transistor by tunnel effect.

As illustrated in FIG. 6, the control gate line CGL is driven, after the bit line BL, the source line SL, and the selection gate SGL have been driven.

During the time t6, after programming pulses of the boost voltages Vpp1 and Vpp2 have been applied, the bit line BL, the selection gate SGL, the control gate line CGL, and the source line SL are all brought back to the ground potential, and the program-verify operation is performed. In the program-verify operation, the selection gate line SGL0 is driven with the power supply voltage Vcc, the bit line BL0 is coupled to the sense amplifier SA, and the source line SL0 is brought to the ground potential. All of the bit lines are pre-charged, and thus a discharge of the selected bit line does not occur. A level of the bit line BL0, selected by a load circuit in the sense amplifier SA, is kept at a predetermined level. As shown in FIG. 5B, a program-verify voltage Vpv is applied to the control gate line CGL0, and the sense amplifier SA detects, based upon a potential of the bit line BL0, whether a drain current Id, which is generated depending on conduction or non-conduction of the memory transistor CG00, exists or not.

The programming operation and the program-verify operation are repeatedly performed. The programming operation ends if it is confirmed that all of the memory transistors are placed in a non-conductive state in the program-verify operation.

During a time t2, all of the bit lines BL0 and BL1 are pre-charged by the pre-charge transistors Ppr0 and Ppr1. However, a pre-charge current may be supplied to respective bit lines, via the memory cells MC00 and MC01, from the source line SL0 even if the pre-charge transistors are not provided. In the above case, both the memory transistors and the selection transistors in the memory cells MC00 and MC01 become conductive.

An applied voltage Vpp1 applied to the control gate line CGL during the programming operation is initially relatively low, and the applied voltage Vpp1 is sequentially changed to boosted voltages, each time the cell transistors pass the program-verify operation.

During the programming operation, the boost voltage Vpp1 is applied to the control gate line CGL0 while the selection transistor SG00 is at a conductive state, and the boost voltage Vpp2, for example 5.5 Volts is applied to the source line SL0. Upon initiation of the programming operation, the threshold voltage is low because electrons are not injected in a floating gate of the memory transistor CG00. For this reason, if the boost voltage Vpp1 is high, a value of a drain current, which flows to the node NA from the source line SL0, of the memory transistor CG00 becomes greater. Consequently, a voltage drop in the selection transistor SG00 becomes greater, and a potential of the node NA is raised Since a voltage between a source and a drain of the memory transistor CG00 becomes smaller, so that the hot electron HE with sufficient energy level is not generated and sufficient: electrons are not injected therein.

As shown in FIG. 7, the boost voltage Vpp1 of the control gate line CGL0 may be set to a low voltage of, for example, approximately 6 Volts upon the initiation of the programming operation. After the boost voltage Vpp1 is applied, the program-verify operation may be performed with, for example, the program-verify voltage of approximately 3.5 Volts. After the cell transistors have passed the program-verify operation, the boost voltage Vpp1 may be set to, for example, approximately 8 Volts by boosting the boost voltage Vpp1, and the programming pulse is applied. Thereafter, the program-verify operation may be performed with the program-verify voltage of, for example, approximately 4.5 Volts. After the cell transistors have passed the program-verify operation, the boost voltage Vpp1 may be set to approximately 10 Volts by boosting the boost voltage Vpp1, and the programming pulse is applied. The program-verify operation may be performed with the program-verify voltage of, for example, approximately 5.5 Volts. The programming pulse is repeatedly applied while the programming voltage Vpp1 and the program-verify voltage are sequentially raised.

Since the low boost voltage Vpp1 is applied upon the initiation of the programming operation, a drain current value of the memory transistor CG00 is limited. For the above reason, a rise in potential in the node NA is limited, and the hot electrons HE with sufficient energy are generated at the memory transistor CG00. If the threshold voltage rises by a certain amount of electrons being injected in the floating gate, a potential of the boost voltage Vpp1 is raised to a higher potential. The hot electrons HE are generated by producing a sufficient drain current while limiting the drain current of the memory transistor. Finally, the hot electrons HE thus generated are injected in the floating gate by virtue of the boost voltage Vpp1 being set to approximately 10 Volts.

Since the programming voltage, for example, boost voltage Vpp1 of the control gate upon the programming pulse being applied, is sequentially raised higher, the corresponding program-verify voltage is also sequentially raised higher. In consequence, rises in threshold levels of the memory transistor with respect to each stage may be confirmed in the program-verify operation.

FIG. 8 illustrates a flowchart of the programming operation. In FIG. 8, the boost voltage Vpp1 is applied, as a programming voltage Vp, to the control gate line CGL. The programming voltage Vp is sequentially raised to higher voltages from a low voltage.

The programming voltage VP, for example, Vpp1 is set to a low initial value Vpi of approximately 6 Volts and is applied to the control gate line CGL (S10) in the sequence of FIG. 8. The hot electrons HE are generated when the programming voltage Vp=Vpi of the initial value is applied to the control gate line CGL and the boost voltage Vpp2 is applied to the source line SL. The hot electrons HE are injected in the floating gate. Thereafter, the program-verify operation is performed (S12). An initial program-verify voltage Vpvi is also set to a low voltage of approximately 3.5 Volts.

The application of the programming voltage (S10) and the program-verify operation (S12) are repeatedly performed until the memory cells pass the program-verify operation (until YES in S14). Since electrons may not be injected with the present programming voltage Vp=Vpi if the number of times of repeat exceeds a given number of times (YES in S16), the programming voltage Vp is changed to a value that is lower than the initial value Vpi (S18). The case where the electrons may not be injected with the initial value Vpi within the given number of times indicates that the memory transistor CG is placed in the over-erased state. Since the threshold voltage is excessively low or negative in the over-erased state, the drain current of the memory transistors becomes excessively greater even with the initial value Vpi, and the potential of the node NA is raised. As a result thereof, the hot electrons HE are not generated effectively. In such cases, it is preferable that the programming voltage Vpp, for example, Vpp1 be set to a lower voltage or a negative voltage, as an exception, and the programming (S10) and the program-verify operation (S12) be performed again.

When the memory cells pass the program-verify operation with the initial value Vpi (YES in S14), the programming voltage Vp, which is obtained by raising the initial value by a predetermined value dV1, is applied (S19 and S20). The program-verify operation is performed with the program-verify voltage Vpv, which is obtained by raising the initial value by a predetermined value dV2 (S19 and S22). Operation S20 and Operation S22 are repeatedly performed until the memory cells pass the program-verify operation (S24 YES). If the memory cells does not pass the program-verify operation even by repeating the program-verify operation (YES in S26), a given number of times, the programming for the memory cells is disabled, and thus the programming fails (S28).

During a period where the programming voltage reaches a maximum voltage (YES in S30), each time the memory cells pass the program-verify operation, (YES in S24), a programming voltage Vp, obtained by raising the programming voltage Vp by the predetermined value dV1, is applied (S32 and S20), and the program-verify operation is performed with a program-verify voltage Vpv, obtained by raising the programming voltage Vp by the predetermined value dV2 (S32 and S22). If a memory cell passes the program-verify operation when the programming voltage Vp may be the maximum voltage, for example, 10 Volts, the programming operation is further performed on another memory cell of the next address (S34).

During the programming operation, the selection gate lines SGL are selected with the address. A selection operation is performed at high speed because the selection gate line decoder-driver circuit SGDEC/DR, including the micro-fabrication transistor Q1, is driven with the power supply voltage Vcc. On the other hand, the control gate lines CGL and the source line SL are driven with the boost voltages Vpp1 and Vpp2. The control gate line driver circuit CGDR and the source line driver circuit SLDR that drive the control gate line CGL and the source line SL does not perform the selection operation based upon the address but drives all of the control gate lines and all of the source lines with the boost voltage. For this reason, the programming operation does not slow down even if the high voltage-resistant transistor Q2 is included.

Figure 9:
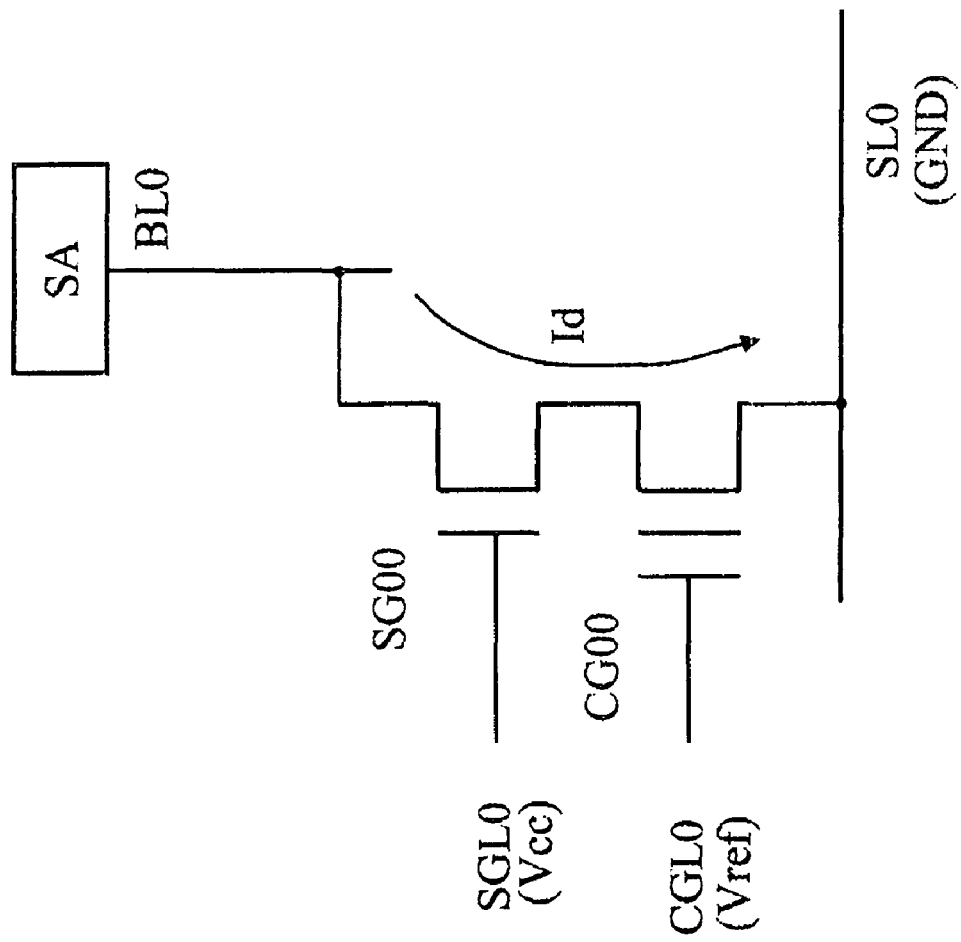
FIG. 9 illustrates a read operation.

FIG. 9 illustrates a read operation. The read operation is the same as the program-verify operation except that a voltage of the control gate becomes a read reference voltage Vref. The source line SL is set to the ground potential. The selected selection gate line SGL is driven with the power supply voltage Vcc. The selected bit line BL is coupled to the sense amplifier SA. The sense amplifier SA includes a load circuit (not shown), and the bit line BL is coupled to the power supply voltage Vcc via the load circuit. The read reference voltage Vref is applied to all of the control gate lines CGL.

The selection transistor SG00 in the selected memory cell is brought into the conductive state. If the memory transistor CG00 is placed in the programmed state (greater threshold voltage), the selected memory cell becomes non-conductive.

If the memory transistor CG00 is placed in the erased state (smaller threshold value), the selected memory cell becomes conductive. For this reason, the drain current Id may be or may not be generated depending on the states of the memory transistor. The potential of the bit line BL differs depending on whether the drain current Id exists or not. The sense amplifier SA detects the potential of the bit line BL.

The selection gate line SGL and the bit line BL are selected based upon the address, also during the read operation. The read reference voltage Vref and the ground voltage GND are applied to all of the control gate lines CGL and all of the source lines SL, respectively. An access time during the read operation decreases owing to the high-speed operation of the selection gate line decoder-driver circuit SGDEC/DR that drives the selection gate line SGL.

The memory cell includes the selection transistor and the memory transistor. For this reason, since the selection transistor does not couple the memory cell to the bit line even if the memory transistor of the non-selection memory cell, coupled to the selected bit line, is placed in the over-erased state during the read operation, a read-out failure does not occur.

Figure 10B:
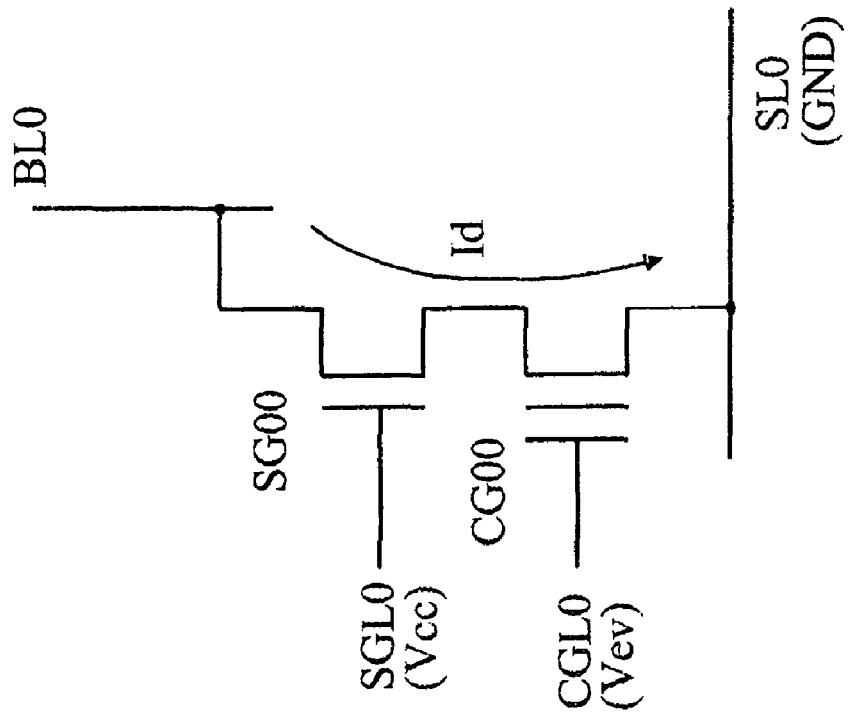
FIG. 10 illustrates an erase operation.
Figure 10A:
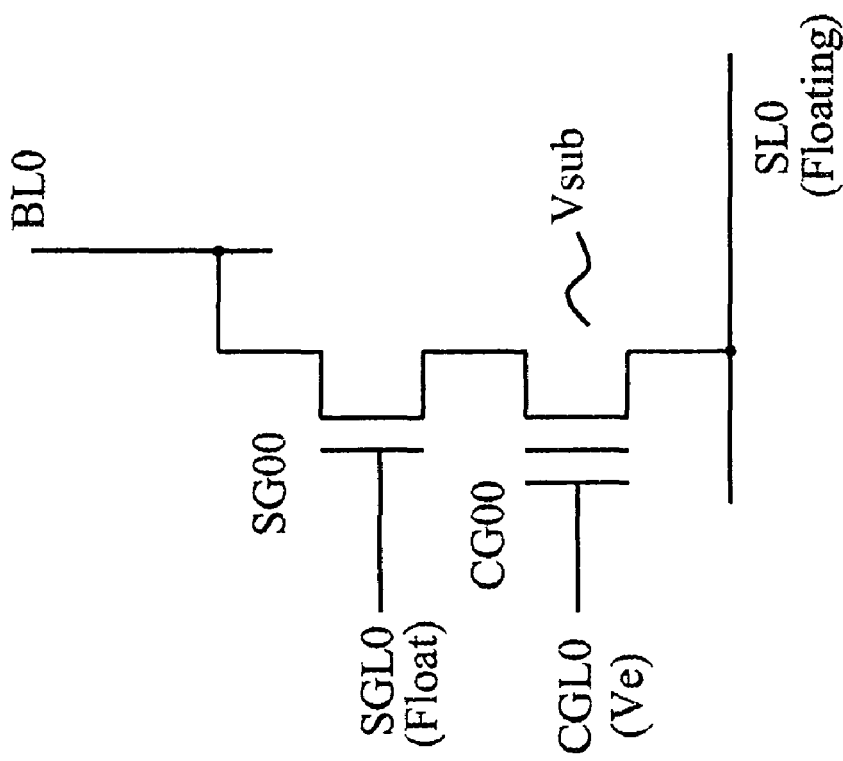

FIGS. 10A and 10B illustrate the erase operation. After all of the memory cells in the block are brought into the programmed state, the erase operation is performed. As shown in FIG. 10A, the selection gate line SGL0 and the source line SL0 for all of the memory cells in the block are brought into the floating state during the erase operation. An erase voltage Ve, for example, −9 Volts may be applied to the control gate CGL of the memory transistor CG00. A voltage Vsub, for example, +9 volts may be applied to the substrate. For this reason, electrons (negative charges) in the floating gate are extracted on a substrate side by Fowler-Nordheim (F-N) tunnel phenomenon.

An erase-verify operation is performed after an erasing pulse has been applied. As shown in FIG. 10B, the erase-verify operation is the same as the program-verify operation and the read operation except that the voltage of the control gate becomes an erase-verify voltage Vev. The selected selection gate line SGL0 is driven to the power supply voltage Vcc. The selected bit line BL0 is coupled to the sense amplifier SA. All of the source lines SL are set to the ground potential, and all of the control gate lines CGL are set to the erase-verify voltage Vev. At this point of time, if erasing causes sufficient electrons to be extracted so that the threshold voltage may be dropped, the memory transistor CG00 does not become conductive, and the drain current Id is not generated. If erasing is not sufficient so that the threshold voltage may not be dropped, the memory transistor CG00 becomes conductive, and the drain current Id is generated The sense amplifier SA detects, by means of the bit line BL0, whether the drain current Id exists or not.

According to aspects of this embodiment, even if the memory cell is brought into the over-erased state, the read operation may be performed normally Selection based upon the address is performed by the drive with the power supply voltage Vcc. For this reason, the drive circuits having the micro-fabrication transistors may be used, so that speeding-up may be achieved. The selection based upon the address may not be performed for the control gate line CGL and the source line SL which are driven with the boost voltage. All of the control gate lines and all of the source lines are concurrently driven. Consequently, the operations of the circuits CGDR and SLDR, which drive the control gate line and the source line, do not impede the high-speed operation.

Example embodiments in accordance with aspects of the present invention have now been described in accordance with the above advantages. It will be appreciated that these examples are merely illustrative of the invention. Many variations and modifications will be apparent to those skilled in the art.

The invention claimed is:

1. A semiconductor memory device comprising:
    a plurality of memory cells, each memory cell including a selection transistor and a memory transistor, the memory transistor having a source and having a control gate which is coupled to the selection transistor;
    a plurality of selection gate lines coupled to a gate of the selection transistor;
    a plurality of control gate lines coupled to the control gate of the memory transistor;
    a plurality of source lines coupled to the source of the memory transistor;
    a plurality of bit lines that intersect the plurality of selection gate lines and are coupled to the selection transistor;
    a selection gate line driver circuit that drives the plurality of selection gate lines;
    a control gate line driver circuit that drives the plurality of control gate lines; and
    a source line driver circuit that drives the plurality of source lines,
    wherein the selection gate line driver circuit comprises a first transistor including a first gate insulation film and drives the selection gate line with a first driving voltage, and
    the control gate line driver circuit and the source line driver circuit comprise a second transistor including a second gate insulation film and, respectively, drive the control gate line and the source line with a boost voltage higher than the first driving voltage.

2. The semiconductor memory device according to claim 1, wherein the first gate insulation film is thicker than the second gate insulation film.

3. The semiconductor memory device according to claim 1, wherein, during a programming operation, a selected bit line is discharged to a first voltage and the unselected bit line is pre-charged to a second voltage, wherein the control gate line driver circuit applies a first programming voltage to the plurality of control gate lines, wherein the source line driver circuit applies a second programming voltage to the plurality of source lines, and wherein the selection gate line driver circuit drives a selected selection gate line with the first driving voltage.

4. The semiconductor memory device according to claim 3, wherein the second voltage is higher than the first voltage.

5. The semiconductor memory device according to claim 3, wherein the first driving voltage is a power supply voltage, and the first programming voltage and the second programming voltage are voltages boosted from the power supply voltage.

6. The semiconductor memory device according to claim 1, wherein, during a read operation, the control gate line driver circuit applies a read reference voltage to the plurality of control gate lines, and the selection gate line driver circuit drives a selected selection gate line with the first driving voltage.

7. The semiconductor memory device according to claim 3, wherein, during the programming operation, the control gate line driver circuit repeatedly applies the first programming voltage by sequentially boosting the first programming voltage.

8. The semiconductor memory device according to claim 7, wherein during the programming operation, the control gate line driver circuit sequentially boosts, in response to the boosted first programming voltage, a corresponding program-verify voltage.

9. The semiconductor memory device according to claim 1, wherein, during a programming operation, a first drain current from the source line to the selection transistor is generated in the memory transistor, and during a read operation, a second drain current from the selection transistor to the source line is generated in the memory transistor, in response to stored data.

10. The semiconductor memory device according to claim 1, further comprising:
    a pre-charge transistor which precharges each of the plurality of bit lines during a programming operation; and
    a discharge transistor, provided in common with the plurality of bit lines, which discharges a selected bit line.

11. The semiconductor memory device according to claim 1, wherein a pre-charge current is supplied to the plurality of bit lines, via the memory cell, from the source line.

* * * * *